United States Patent [19]

Odell

[11] 4,176,323

[45] Nov. 27, 1979

[54] TRANSISTORIZED POWER AMPLIFIER

[75] Inventor: Robert Odell, Pasadena, Calif.

[73] Assignee: Harman International Industries, Inc., Lake Success, N.Y.

[21] Appl. No.: 917,738

[22] Filed: Jun. 21, 1978

[51] Int. Cl.² .......................... H03F 3/18; H03F 3/30
[52] U.S. Cl. ................................... 330/263; 330/255; 330/265; 330/268
[58] Field of Search ............... 330/255, 262, 263, 265, 330/266, 267, 268

[56] References Cited

U.S. PATENT DOCUMENTS 3,944,944  3/1976  Ellenbecker .................. 330/263 X Primary Examiner—James B. Mullins
Attorney, Agent, or Firm—Hopgood, Calimafde, Kalil, Blaustein & Lieberman

[57] ABSTRACT

A transistorized power amplifier includes a differential pair coupled to a push-pull driver. The latter provides an amplified signal to an output stage through a compound driver, which comprises a pair of complementary transistors. The collector of the input transistor of the compound driver is connected to the base of the other transistor in the compound driver.

2 Claims, 1 Drawing Figure

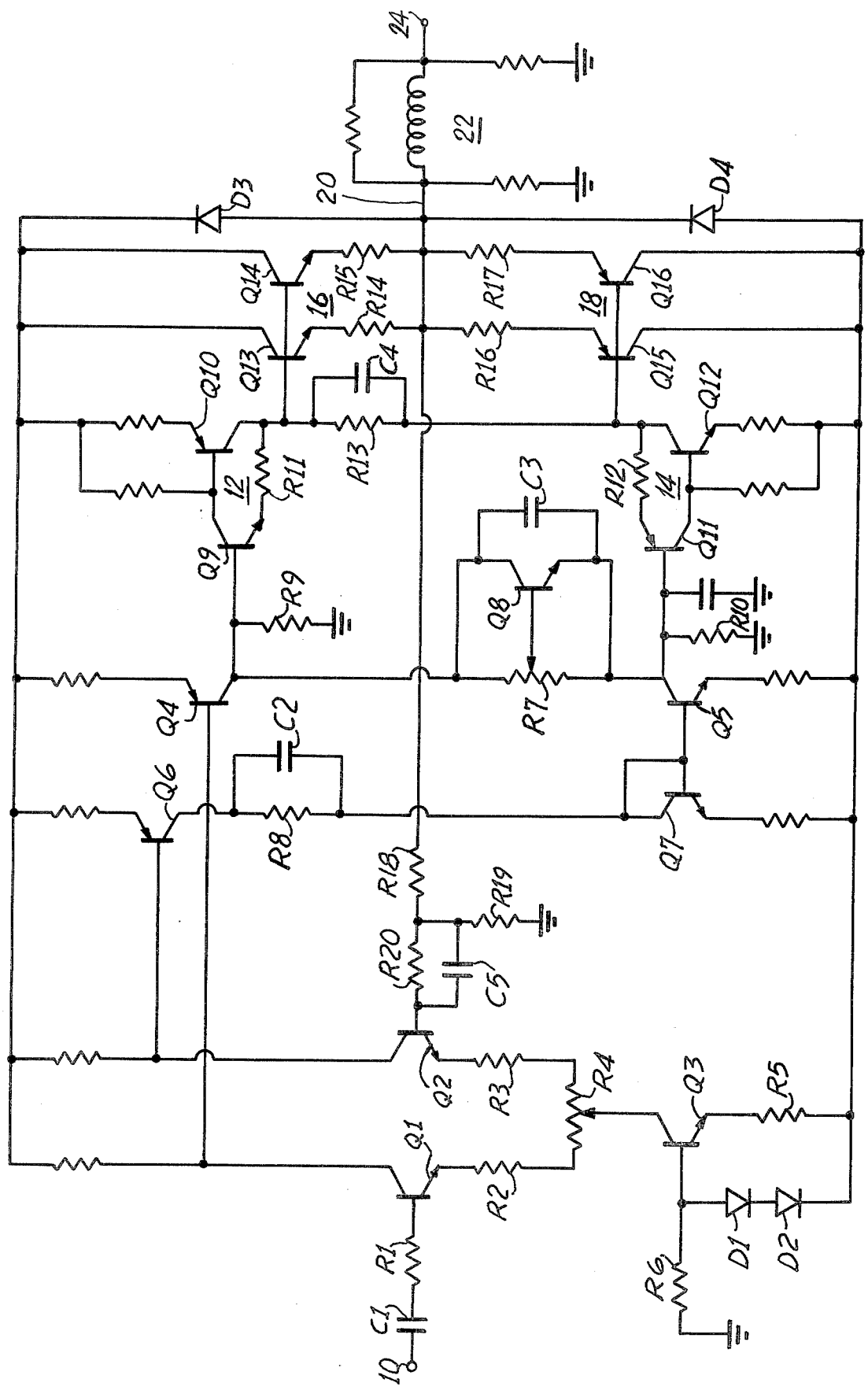

TRANSISTORIZED POWER AMPLIFIER

The present invention relates generally to amplifiers, and more particularly to a transistorized amplifier having particular utility in a high-fidelity audio power amplifier.

Audio-frequency amplifiers for use in high-fidelity systems are generally characterized by uniform response over the audio-frequency band and low distortion for all useful levels of audio signals. In the design of such amplifiers, it is also desirable to achieve high efficiency of amplification.

Another factor in the design of audio amplifiers is more difficult to measure on laboratory equipment, but is also a significant aspect of the performance of an audio-frequency amplifier. This factor is the quality of the sound produced when the output of the amplifier is applied to a high-quality loudspeaker or other transducer. Although this factor is relatively subjective in nature, as compared to measurable parameters such as gain and distortion, what constitutes improved sound quality in an audio system can be readily perceived by those with experience in the field.

A conventional audio power amplifier use in high-fidelity systems is described in U.S. Pat. No. 3,428,908 to Bart N. Locanthi. In that amplifier, the output of a differential amplifier is coupled to the load through transistors connected in a Darlington configuration. All of the transistors in each Darlington stage are of the same conductivity type, that is, either PNP or NPN. While this amplifier provides generally satisfactory audio amplification, there are areas in this amplifier such as efficiency and sound quality that can be improved upon.

It is an object of the present invention to provide an audio amplifier having an improved quality of audio output.

It is a further object of the invention to provide an amplifier of the type described having an improved efficiency driver-buffer configuration.

In the amplifier of the present invention, the conventional Darlington connection of the output driver or buffer is arranged in the form of a pair of complementary (NPN and PNP) transistors connected to one another. The collector of the input transistor of the compound driver is connected to the base of the output transistor in the compound driver pair. The collector of the output transistor is connected to the emitter of the input transistor and to the bases of the output stage transistors.

To the accomplishment of the above and such further objects as may hereinafter appear, the present invention relates to a transistorized amplifier substantially as defined in the appended claims and as described in the accompanying specification considered together with the single FIGURE, which is a schematic drawing of an amplifier according to an embodiment of the present invention.

As illustrated, the amplifier includes an input terminal 10, which receives an audio signal from any conventional audio source, such as an FM tuner, preamplifier, or phonograph cartridge. Input terminal 10 is coupled through a capacitor C1 and a resistor R1 to the base of a transistor Q1, which together with transistor Q2 constitutes a differential amplifier pair.

The emitters of transistors Q1 and Q2 are connected to one another through resistors R2 and R3 and a potentiometer R4. The tap of the potentiometer is connected to the collector of a transistor Q3, which serves as the current source for the differential pair of transistors Q1 and Q2. The emitter of transistor Q3 is connected to ground through a resistor R5 and to its base through a pair of series-connected diodes D1 and D2. The base of transistor Q3 is connected through a resistor R6 to ground.

The collector of transistor Q1 is connected to the base of a transistor Q4, which is one half of a push-pull Class A driver, the other half of which consists of a transistor Q5, the collector of which is connected to the collector of transistor Q4 through a potentiometer R7.

The collector of transistor Q2 is connected to the base of a transistor Q6. The collector of this transistor is connected through the parallel circuit of a resistor R7 and a capacitor C2 to the collector of a transistor Q7. The base of transistor Q7 is tied to its collector and is also connected to the base of transistor Q5.

The tap of potentiometer R7 is connected to the base of a transistor Q8, the emitter of which is connected to one end of the potentiometer and to the collector of transistor Q5, as well as to its collector by means of a capacitor C3. The collector of transistor Q8 is also connected to the other end of potentiometer R7 and to the collector of transistor Q4.

In the operation of the portion of the amplifier thus far described, the collector of transistor Q1 drives transistor Q4. The collector of transistor Q2 drives transistor Q6 and establishes a collector current in transistor Q6, which is substantially equal to the collector current of transistor Q4. The collector current of transistor Q6 is driven through current mirror transistor Q7, which establishes a current in transistor Q5, which is equal to the current in transistor Q6, which, as noted, is also equal to the current in transistor Q4. This arrangement thus establishes a push-pull Class A driver made up of transistors Q4 and Q5. The transistor Q8 operates as a $V_{BE}$ multiplier, which establishes the idling current for the output stage, which is described in a later part of the specification.

The load on the push-pull driver composed of transistors Q4 and Q5 consists of a resistor R9 connected to the collector of transistor Q4, in parallel with a resistor R10 connected to the collector of transistor Q5, in parallel with the load impedance reflected through the output stage and the compound buffer states, which are described in a later part of this specification.

The outputs of the push-pull driver are respectively connected to a first compound buffer stage 12 and to a second compound buffer stage 14. More particularly, the collector of transistor Q4 is connected to the base of an NPN transistor Q9, which together with a complementary or PNP transistor Q10, makes up the first compound buffer stage 12. Similarly, the collector of transistor Q5 is connected to the base of a PNP transistor Q11, which together with an NPN transistor Q12, makes up the second compound buffer 14.

The collectors of transistors Q9 and Q11 are respectively connected to the bases of transistors Q10 and Q12, and the emitters of transistors Q9 and Q11 are respectively connected to the collectors of transistors Q10 and Q12 through resistors R11 and R12. The collectors of transistors Q10 and Q12 are, in turn, connected to one another through a resistor R13 in parallel connection with a capacitor C4.

Compound buffer stage 12 drives an output state 16 made up of NPN transistors Q13 and Q14, and compound buffer stage 14 drives a second complementary output stage composed of PNP transistors Q15 and Q16.

More specifically, the collector of transistor Q10 is connected to the bases of transistors Q13 and Q14, whose collecters are grounded. Similarly, the collector of transistor Q12 is connected to the bases of transistors Q15 and Q16, whose collecters are grounded.

The emitters of transistors Q13 and Q14 are respectively connected to a line 20 through resistors R14 and R15, and the emitters of transistors Q15 and Q16 are respectively connected to line 20 through resistors R16 and R17. The collectors of transistors Q13 and Q14 are also connected to line 20 through a diode D3, and similarly the collectors of transistors Q15 and Q16 are connected to line 20 through a diode D4.

The amplifier output on line 20 is coupled to a capacitance-inductive output network 22, which shapes the amplifier output in the presence of capacitive loads. The output of network 22 at output terminal 24 is adapted to be coupled to a load (not shown), which typically is in the form of a loudspeaker.

The output signal is also applied to the base of transistor Q2 through a resistance divider made up of resistors R18 and R19, and the parallel arrangement of a resistor R20 and capacitor C5, such that the overall gain of the amplifier is essentially the same for both AC and DC. The function of resistor R13 is to speed up the "turn on" and "turn off" of the transistors in the output stages 16 and 18.

The configuration of the two compound driver or buffer stages 12 and 14, in place of the Darlington connections conventionally utilized in such amplifiers, results in one less $V_{BE}$ drop in the signal path between the Class A driver and the output stages, while providing the same amount of current amplification as a Darlington connection. In addition, the arrangement of the compound driver stages in the amplifier of the present invention results in a perceived improvement in the quality of the sound produced by a transducer connected to the amplifier output, although the reason for this improved sound quality cannot be determined with certainty, nor can it be quantitatively measured.

It will be understood that although the present invention has been herein described with respect to a single embodiment thereof, modifications may be made therein without necessarily departing from the spirit and scope of the invention.

What is claimed is:

1. A transistor amplifier comprising an input, a push-pull driver transistor pair operatively connected to said input, first and second output stages, and first and second compound buffer stages respectively operatively connected intermediate the outputs of said push-pull driver and said first and second output stages, each of said first and second buffer stages comprising a first transistor and a second complementary transistor, the base of said first transistor being orperatively connected to an output of said push-pull driver, the collector of said first transistor being operatively connected to the base of said second transistor, the emitter of said first transistor being operatively connected to the collector of said second transistor, and the collector of said second transistor being operatively connected to an input of said output stage.

2. The amplifier of claim 1, wherein the collectors of said second transistors in said first and second transistors are operatively connected to one another.

* * * * *